United States Patent

Yoshizawa

(10) Patent No.: US 9,997,370 B2
(45) Date of Patent: Jun. 12, 2018

(54) ELECTRONIC APPARATUS, MANUFACTURING METHOD THEREOF, OSCILLATOR, ELECTRONIC APPLIANCE, AND MOBILE UNIT

(71) Applicant: SEIKO EPSON CORPORATION, Tokyo (JP)

(72) Inventor: Takahiko Yoshizawa, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 4 days.

(21) Appl. No.: 15/206,926

(22) Filed: Jul. 11, 2016

(65) Prior Publication Data

US 2017/0033049 A1    Feb. 2, 2017

(30) Foreign Application Priority Data

Jul. 29, 2015  (JP) .................................. 2015-149342

(51) Int. Cl.
    *H01L 21/3105* (2006.01)
    *B81C 1/00* (2006.01)
    *H01L 23/532* (2006.01)

(52) U.S. Cl.
    CPC .... *H01L 21/31053* (2013.01); *B81C 1/00293* (2013.01); *B81B 2201/0271* (2013.01); *B81C 2203/0136* (2013.01); *B81C 2203/0145* (2013.01); *H01L 23/53214* (2013.01)

(58) Field of Classification Search
    CPC combination set(s) only.
    See application file for complete search history.

(56) References Cited

U.S. PATENT DOCUMENTS

| 5,963,788 | A | 10/1999 | Barron et al. | |
|---|---|---|---|---|
| 8,921,997 | B2 | 12/2014 | Shimooka et al. | |
| 8,952,467 | B2 | 2/2015 | Yoshizawa | |
| 9,190,954 | B2 | 11/2015 | Yoshizawa | |
| 2004/0042126 | A1* | 3/2004 | Watanabe | B82Y 10/00 360/319 |
| 2011/0121416 | A1* | 5/2011 | Quevy | B81B 7/02 257/417 |
| 2014/0021562 | A1* | 1/2014 | Furuhata | B81B 7/0006 257/415 |

FOREIGN PATENT DOCUMENTS

| JP | 2007-222957 A | 9/2007 |
|---|---|---|
| JP | 2012-045656 A | 3/2012 |
| JP | 2014-086447 A | 5/2014 |
| JP | 2014-192435 A | 10/2014 |

* cited by examiner

*Primary Examiner* — Ratisha Mehta
(74) *Attorney, Agent, or Firm* — Oliff PLC

(57) ABSTRACT

An electronic apparatus according to the invention includes a substrate, a side wall that is disposed directly on the substrate or via an insulation film and forms a hollow, a functional element that is disposed within the hollow, a first layer that is disposed on the side wall so as to cover the hollow and has a first through hole that communicates with the hollow, a second layer that is disposed on the first layer so as to cover the hollow and has a second through hole that has a diameter smaller than a diameter of the first through hole and at least partially overlaps the first through hole as viewed in plan view, and a third layer that is disposed on the second layer so as to seal at least the second through hole.

18 Claims, 6 Drawing Sheets

ELECTRONIC APPARATUS, MANUFACTURING METHOD THEREOF, OSCILLATOR, ELECTRONIC APPLIANCE, AND MOBILE UNIT

BACKGROUND

1. Technical Field

The present invention relates to an electronic apparatus including a functional element such as a resonator, a sensor or an actuator, and a manufacturing method thereof. Furthermore, the invention relates to an oscillator, an electronic appliance, a mobile unit and the like that use such an electronic apparatus.

2. Related Art

For example, in an electronic apparatus including a capacitive type resonator as a functional element such as a MEMS (Micro Electro Mechanical Systems) device, the resonator is hermetically sealed in a vacuum state or with an inert gas contained within a hermetically sealed structure. Even in an electronic apparatus that does not require a vacuum state or the like, in order to prevent the influence of dust, moisture and the like, the functional element is hermetically sealed within the hermetically sealed structure.

In order to form a hermetically sealed structure in such an electronic apparatus, for example, a sacrificial layer is formed within a cavity where the functional element is provided, the cavity is covered with a cover portion having release holes formed therein, and thereafter the sacrificial layer is removed by release etching. Furthermore, a sealing layer for sealing the release holes or the like is formed on the cover portion.

However, the cover portion is easily deformed during the step of forming the sealing layer or the like on the cover portion. Accordingly, the cover portion needs to be thick in order to increase the strength. It is therefore not possible to form micro release holes in the cover portion, and thus the release holes have a large diameter. As a result, the sealing layer for sealing the release holes also becomes thick, and therefore it has been difficult to miniaturize the electronic apparatus.

As a related technique, JP-A-2014-192435 (paragraphs [0008], [0027] and [0036], FIG. 1) discloses, in FIG. 1, an electronic apparatus including a substrate 10, an underlying layer 20 that is formed on the substrate 10 and has an opening 22, a functional element 30 that is provided on the underlying layer 20, a surrounding wall 40 that forms a hollow 1 for housing the functional element 30, at least a portion of the surrounding wall 40 being disposed within the opening 22, and a cover member 50 that is disposed above the surrounding wall 40 and covers the hollow 1.

The cover member 50 is composed of a first sealing layer 54 having a through hole 52 and a second sealing layer 56 that is stacked on the first sealing layer 54 and seals the through hole 52. If the thickness of the first sealing layer 54 is increased so as to secure the strength, the diameter of the through hole 52 needs to be increased in order to form the through hole 52. This requires the thickness of the second sealing layer 56 for sealing the through hole 52 to be increased, which hampers miniaturization of the electronic apparatus.

SUMMARY

An advantage of some aspects of the invention relates to the miniaturization of an electronic apparatus while maintaining the strength of a cover portion for covering a hollow in which a functional element is disposed.

Also, an advantage of some aspects of the invention provides an oscillator, an electronic appliance, a mobile unit and the like that use such an electronic apparatus.

An electronic apparatus according to a first aspect of the invention includes: a substrate; a side wall that is disposed directly on the substrate or via an insulation film and forms a hollow; a functional element that is disposed within the hollow; a first layer that is disposed on the side wall so as to cover the hollow and has a first through hole that communicates with the hollow; a second layer that is disposed on the first layer so as to cover the hollow and has a second through hole that has a diameter smaller than a diameter of the first through hole and at least partially overlaps the first through hole as viewed in plan view; and a third layer that is disposed on the second layer so as to seal at least the second through hole.

According to the first aspect of the invention, the cover portion that covers the hollow in which the functional element is disposed is configured to have a two-layer structure including at least the first layer and the second layer, and the through hole of the second layer is configured to have a diameter smaller than that of the through hole of the first layer, and the thickness of the sealing layer is thereby reduced. It is therefore possible to miniaturize the electronic apparatus while maintaining the strength of the cover portion.

Here, it is desirable that the first layer has a rigidity higher than the second layer. Also, the first layer may be configured to be thicker than the second layer. With this configuration, the first layer can be formed as a firm film, the second layer can be formed as a thin film that can be microfabricated, and the diameter of the through hole of the second layer can be sufficiently reduced. For example, it is desirable that the through hole of the second layer has a diameter of 0.3 µm or less. With this configuration, the thickness of the sealing layer can be sufficiently reduced.

Also, the side wall and the functional element may be disposed within a surface recess of the substrate. In this case, the need to deepen the surface recess can be eliminated, and an interconnect and the like can be disposed above the functional element. For example, the surface recess may be disposed in a first region of the substrate, and a MOS transistor may be disposed in a second region of the substrate. As a result of the MOS transistor and the functional element being disposed on the same substrate, the electronic apparatus can be miniaturized.

An oscillator according to a second aspect of the invention includes any one of the above-described electronic apparatus. According to the second aspect of the invention, it is possible to provide a miniaturized oscillator by using the electronic apparatus that has been miniaturized while maintaining the strength of the cover portion that covers the hollow in which the functional element is disposed.

An electronic appliance and a mobile unit according to a third aspect of the invention include any one of the above-described electronic apparatus. According to the third aspect of the invention, it is possible to provide an electronic appliance and a mobile unit in which an oscillator that generates a clock signal is miniaturized by using the electronic apparatus that has been miniaturized while maintaining the strength of the cover portion that covers the hollow in which the functional element is disposed.

A method of manufacturing an electronic apparatus according to a fourth aspect of the invention includes: (a) forming a side wall that forms a hollow and a functional element that is disposed within the hollow directly on a substrate or via an insulation film; (b) forming a sacrificial layer within the hollow; (c) forming a first layer that covers the hollow on the side wall; (d) forming a second layer that covers the hollow on the first layer; (e) forming a first through hole that communicates with the first layer in the second layer; (f) forming a second through hole in the first layer, the second through hole having a diameter larger than a diameter of the first through hole and at least partially overlapping the first through hole as viewed in plan view; (g) removing the sacrificial layer within the hollow through the first and second through holes by release etching; and (h) forming a third layer that seals at least the first through hole on the second layer.

According to the fourth aspect of the invention, the cover portion covering the hollow in which the functional element is disposed is configured to have a two-layer structure including at least the first layer and the second layer, and after a micro through hole has been formed in the second layer, a through hole having a diameter larger than the through hole is formed in the first layer, and the thickness of the sealing layer is thereby reduced. It is therefore possible to miniaturize the electronic apparatus while maintaining the strength of the cover portion.

Here, the step (f) may include performing wet etching or isotropic dry etching on the first layer by using at least the second layer as a mask. By doing so, it is possible to form the second through hole having a diameter larger than that of the first through hole.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
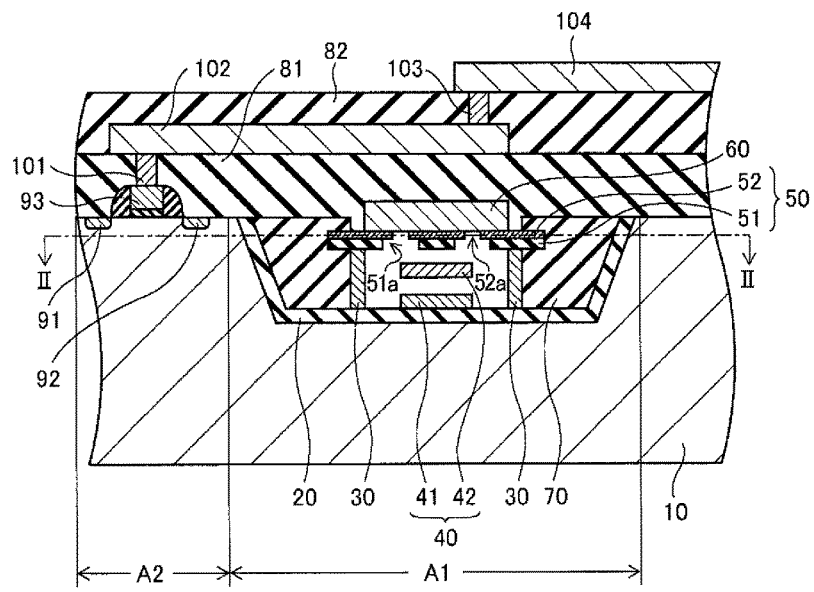
FIG. 1 is a side cross-sectional view showing a portion of an electronic apparatus according to an embodiment of the invention.

Hereinafter, an embodiment of the invention will be described in detail with reference to the drawings. The same constituent elements are given the same reference numerals, and thus a redundant description is omitted.

An electronic apparatus according to an embodiment of the invention is an electronic apparatus including a functional element such as a resonator, a sensor or an actuator that is hermetically sealed within a hermetically sealed structure. The following description will be given of an electronic apparatus in which a capacitive type resonator serving as a functional element and a MOS field-effect transistor serving as a circuit element are formed on a single substrate, which is used as an example. The resonator is hermetically sealed, for example, within a cavity (hollow) of a trench (surface recess) in the substrate.

Figure 2:
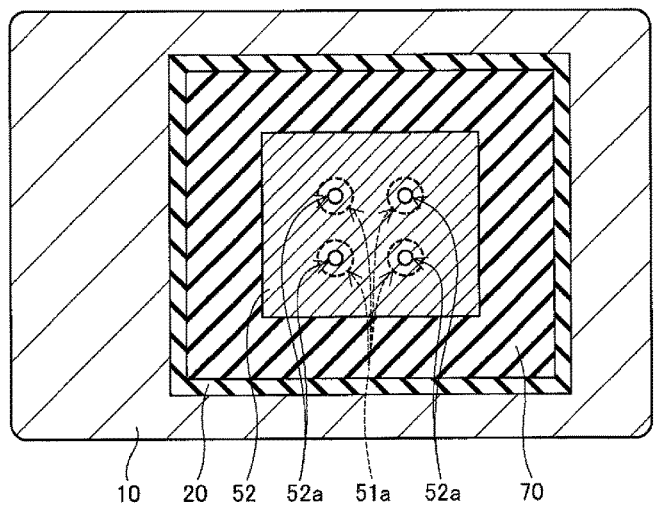
FIG. 2 is a cross-sectional plan view taken along the line II-II shown in FIG. 1.

FIG. 1 is a side cross-sectional view showing a portion of an electronic apparatus according to an embodiment of the invention, and FIG. 2 is a cross-sectional plan view taken along the line II-II shown in FIG. 1. As shown in FIG. 1, the electronic apparatus includes a substrate 10, a side wall 30 that forms a cavity, a resonator 40 that is disposed within the cavity, a cover portion 50 that covers the cavity with a gap between the cover portion 50 and the resonator 40, and a sealing layer 60.

The substrate 10 is made of, for example, a semiconductor material such as a single silicon crystal. A trench is formed in a first region A1 of a main surface (upper surface in the diagram) of the substrate 10, and an impurity diffusion region of a transistor is formed in a second region A2 of the main surface of the substrate 10. An insulation film 20 made of, for example, silicon nitride ($Si_3N_4$) is disposed within the trench of the substrate 10. The side wall 30 is disposed on the substrate 10 via the insulation film 20.

The resonator 40 includes a lower electrode 41 that is disposed on a bottom surface of the trench of the substrate 10 via the insulation film 20 and an upper electrode 42 that is disposed against the lower electrode 41. The side wall 30 may be disposed directly on the bottom surface of the trench of the substrate 10. In the case where a substrate made of a highly insulating material such as glass, ceramics or resin is used, the side wall 30 and the lower electrode 41 of the resonator 40 may be disposed directly on the bottom surface of the trench of the substrate 10.

The side wall 30 and the lower electrode 41 and the upper electrode 42 of the resonator 40 are made of, for example, polysilicon doped with an impurity to have conductivity, or the like. The upper electrode 42 of the resonator 40 includes a cantilever structure whose one end is fixed and the other end is movable. The lower electrode 41 and the upper electrode 42 are electrically connected to their corresponding external connection electrodes (not shown).

A space within the cavity surrounded by the side wall 30 is in a vacuum state or contains an inert gas. In the resonator 40 provided within the cavity, upon application of an alternating voltage across the lower electrode 41 and the upper electrode 42, a mechanical vibration of the upper electrode 42 is excited by an electrostatic force. The mechanical vibration changes the capacitance between the lower electrode 41 and the upper electrode 42.

The cover portion 50 includes a first layer 51 that is disposed on the side wall 30 and covers the cavity and a second layer 52 that is disposed on the first layer 51 and covers the cavity. The first layer 51 is made of, for example, silicon nitride ($Si_3N_4$) or the like, which has a high mechanical strength and is highly resistant to release etching. The second layer 52 is made of, for example, polysilicon or the like, which is relatively easily etched.

The first layer 51 has a through hole 51a that communicates with the cavity, and the second layer 52 also has a through hole 52a that communicates with the cavity. The through hole 52a has a diameter smaller than that of the through hole 51a, and at least partially overlaps with the through hole 51a as viewed in plan view. The expression "as viewed in plan view" as used herein refers to viewing the constituent elements from a direction vertical to the main surface of the substrate 10.

The through holes 51a and 52a correspond to release holes used to remove a sacrificial layer formed within the cavity by release etching. After the sacrificial layer has been removed, the cavity is brought into a vacuum state or filled with an inert gas, and a third layer (sealing layer) 60 is formed on the second layer 52 by using a sealing material such as aluminum (Al). As a result, the sealing layer 60 is disposed on the second layer 52 and seals at least the through hole 52a.

Within the trench of the substrate 10, in an external region of the side wall 30, an insulation film 70 made of, for example, silicon dioxide ($SiO_2$) or the like is disposed. On the substrate 10 where the sealing layer 60, the insulation film 70 and the like are disposed, interlayer insulation films 81 and 82 made of, for example, silicon dioxide ($SiO_2$), BPSG (Boron Phosphorus Silicon Glass) or the like are disposed. The interlayer insulation films 81 and 82 extend to the second region A2 of the substrate 10 where a circuit element is formed.

In the second region A2, for example, within the substrate 10, there are impurity diffusion regions 91 and 92 that serve as the source and the drain of a MOS field-effect transistor, and a gate electrode 93 is disposed on the substrate 10 via a gate insulation film. The gate electrode 93 is electrically connected to an interconnect 102 made of aluminum (Al) or the like disposed on the interlayer insulation film 81 via a contact plug (electrode) 101 made of tungsten (W) or the like. Furthermore, the interconnect 102 is electrically connected to an interconnect 104 made of aluminum (Al) or the like disposed on the interlayer insulation film 82 via a contact plug (electrode) 103 made of tungsten (W) or the like.

According to the present embodiment, the cover portion 50 that covers the hollow in which the functional element is disposed is configured to have a two-layer structure including at least the first layer 51 and the second layer 52, and the through hole 52a of the second layer 52 is configured to have a diameter smaller than that of the through hole 51a of the first layer 51, and the thickness of the sealing layer 60 is thereby reduced. It is therefore possible to miniaturize the electronic apparatus while maintaining the strength of the cover portion 50. Particularly when the side wall 30 and the functional element are disposed within the trench of the substrate 10, the need to deepen the trench can be eliminated, and the interconnect 102 and the like can be disposed above the functional element. Also, by disposing the MOS transistor and the functional element on the same substrate, the electronic apparatus can be miniaturized.

Here, it is desirable that the first layer 51 has a rigidity higher than the second layer 52. Also, the first layer 51 may be configured to be thicker than the second layer 52. With this configuration, the first layer 51 can be formed as a firm film, the second layer 52 can be formed as a thin film that can be microfabricated, and the diameter of the through hole 52a of the second layer 52 can be sufficiently reduced. For example, it is desirable that the through hole 52a of the second layer 52 has a diameter of 0.3 μm or less. With this configuration, the thickness of the sealing layer 60 can be sufficiently reduced.

Next, a method of manufacturing the electronic apparatus shown in FIGS. 1 and 2 will be described.

Figure 3A:
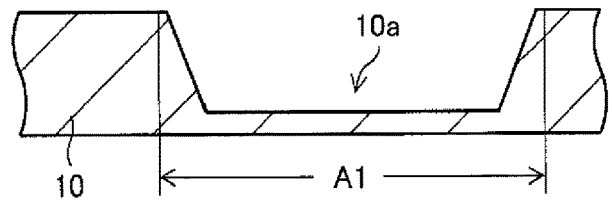
FIGS. 3A to 3E are side cross-sectional views showing a process for manufacturing an electronic apparatus according to an embodiment of the invention.

FIGS. 3A to 5O are side cross-sectional views showing a process for manufacturing an electronic apparatus according to an embodiment of the invention. First, as shown in FIG. 3A, for example, a resist is provided on a portion of a main surface of a substrate 10 made of single silicon crystal or the like by a photolithography method, and then dry etching is performed by using the resist as a mask. A trench 10a is thereby formed in a first region A1 of the main surface of the substrate 10. After that, the resist is removed.

Figure 3B:
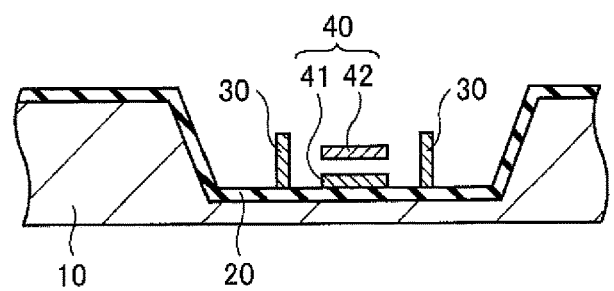

Next, as shown in FIG. 3B, an insulation film 20 made of silicon nitride ($Si_3N_4$) or the like is formed in a region including a bottom surface of the trench of the substrate 10. Also, polysilicon doped with an impurity to have conductivity or the like is formed on the bottom surface of the trench of the substrate 10 via the insulation film 20 and then patterned by dry etching using a resist as a mask. A side wall 30 forming a cavity and a lower electrode 41 of a resonator are thereby formed. Furthermore, a gap sacrificial layer is formed on the lower electrode 41, and thereafter conductive polysilicon or the like is formed, which are then patterned by drying etching using a resist as a mask. An upper electrode 42 of the resonator is thereby formed. After that, the gap sacrificial layer is removed by wet etching.

In this way, the side wall 30 forming a cavity and a resonator 40 are formed on the bottom surface of the trench of the substrate 10 via the insulation film 20, the resonator 40 being disposed within the cavity. The side wall 30 may be formed directly on the bottom surface of the trench of the substrate 10. In the case where a substrate made of a highly insulating material such as glass, ceramics or resin is used, the side wall 30 and the lower electrode 41 of the resonator 40 may be provided directly on the substrate.

Figure 3C:
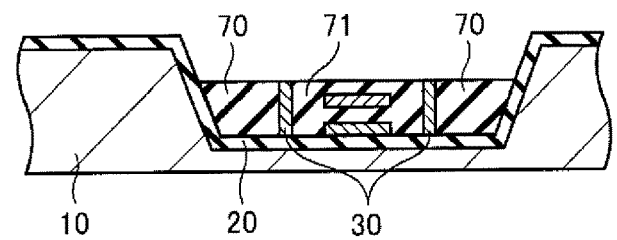

Next, an insulation film made of silicon dioxide ($SiO_2$) or the like is deposited, by using a plasma CVD method or the like, on the substrate 10 having the side wall 30, the resonator 40 and the like formed thereon. After that, the insulation film is polished by CMP (Chemical Mechanical Polishing) and patterned by dry etching. As a result, as shown in FIG. 3C, an insulation film 70 made of silicon dioxide ($SiO_2$) or the like is formed outside the side wall 30 within the trench of the substrate 10, and a sacrificial layer 71 made of silicon dioxide ($SiO_2$) or the like is formed within the cavity inside the side wall 30.

Figure 3D:
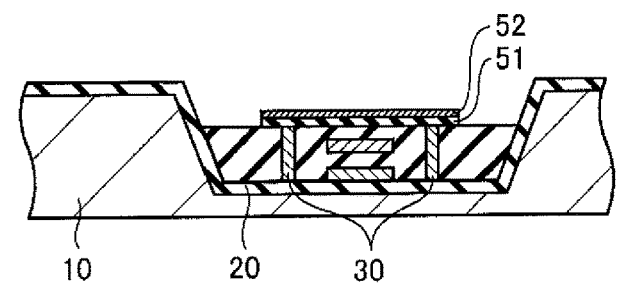

Next, an insulation film made of silicon nitride (SiN) or the like is formed so as to cover the insulation film 70, the sacrificial layer 71 and the like, and a film made of polysilicon or the like is further formed thereon. After that, the films are patterned by dry etching using a resist as a mask. As a result, as shown in FIG. 3D, a first layer 51 made of silicon nitride (SiN) or the like covering the cavity is formed on the side wall 30, and a second layer 52 made of polysilicon or the like covering the cavity is formed on the first layer 51.

Figure 3E:
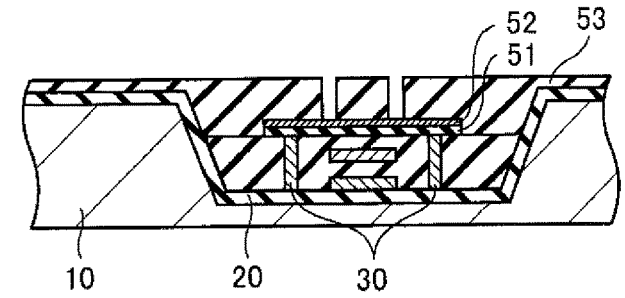
Figure 4F:
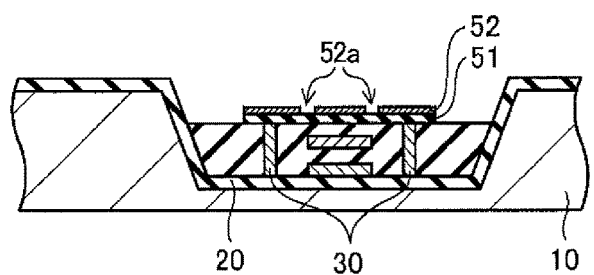
FIGS. 4F to 4J are side cross-sectional views showing the process for manufacturing an electronic apparatus according to an embodiment of the invention.

Next, as shown in FIG. 3E, a resist 53 is formed, by using a photolithography, on the substrate 10 having the first layer 51, the second layer 52 and the like formed thereon. Furthermore, the second layer 52 is dry etched by using the resist 53 as a mask, and thereafter the resist 53 is removed. In this way, as shown in FIG. 4F, a through hole 52a communicating with the first layer 51 is formed in the second layer 52. Here, it is desirable that the through hole 52a has a diameter of about 0.3 μm or less.

Figure 4G:
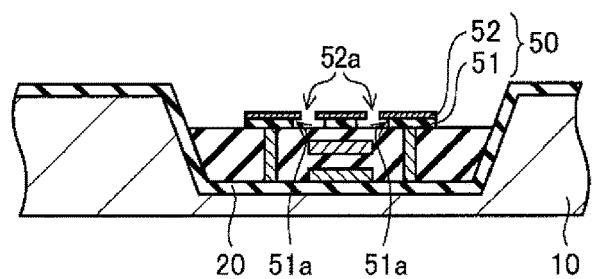

Next, by etching the first layer 51 by using at least the second layer 52 as a mask, as shown in FIG. 4G, a through hole 51a is formed in the first layer 51. The through hole 51a has a diameter larger than that of the through hole 52a, and at least partially overlaps with the through hole 52a as viewed in plan view. The etching performed in this step may be wet etching, or may be isotropic dry etching. By doing so, it is possible to form the through hole 51a having a diameter larger than that of the through hole 52a.

Figure 4H:
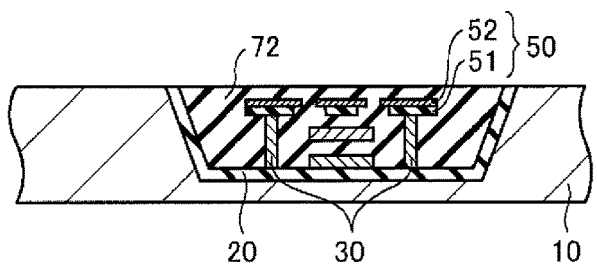

In this way, a cover portion 50 is formed that has a two-layer structure including the first layer 51 and the second layer 52 and in which release holes are formed. Next, an insulation film 72 made of silicon dioxide ($SiO_2$) or the like is deposited, by using a plasma CVD method or the like, on the substrate 10 having the cover portion 50, and the like formed thereon. After that, the deposited insulation film 72 and the previously formed insulation film 20 are polished by CMP or the like so as to planarize the surface of the substrate 10 as shown in FIG. 4H.

Figure 4I:
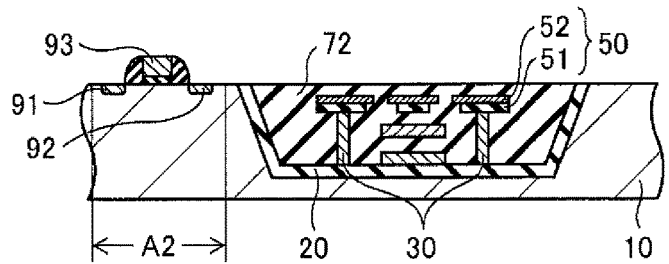

After that, as shown in FIG. 4I, for example, a MOS field-effect transistor is formed on a second region A2 of the substrate 10 as a circuit element. To be specific, a gate electrode 93 is formed on the substrate 10 via a gate insulation film, and impurity diffusion regions 91 and 92, which will serve as the source and the drain, are formed in the substrate 10 on opposite sides of the gate electrode 93. At this time, a side wall having insulating properties may be formed on the side walls of the gate insulation film and the gate electrode 93.

Figure 4J:
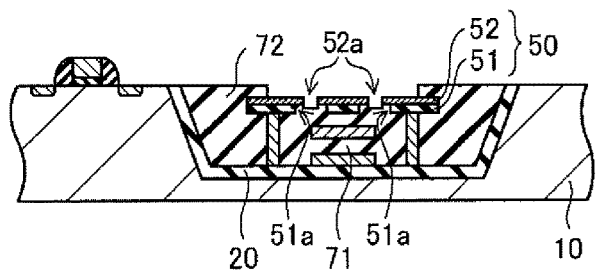
Figure 5K:
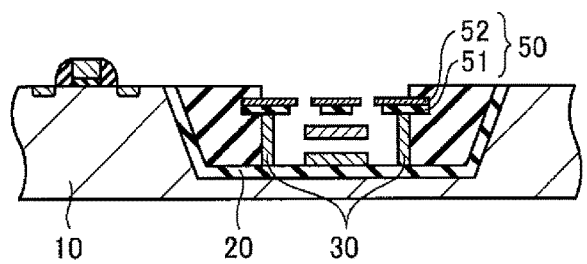
FIGS. 5K to 5O are side cross-sectional views showing the process for manufacturing an electronic apparatus according to an embodiment of the invention.

Next, as shown in FIG. 4J, the insulation film 72 made of silicon dioxide ($SiO_2$) or the like is dry etched by using a resist as a mask so as to expose a portion of the cover portion 50. Furthermore, the sacrificial layer 71 within the cavity is removed through the through hole 51a of the first layer 51 and the through hole 52a of the second layer 52 by wet etching (release etching) using fluorinated acid or the like as an etching solution. As a result, a structure as shown in FIG. 5K is obtained.

Figure 5L:
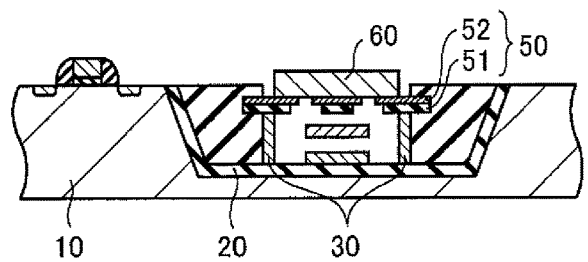

Next, for example, in a vacuum chamber, a sealing material such as aluminum (Al) is deposited on the cover portion 50 by sputtering (high-vacuum film-forming method), and the deposited sealing material is patterned by dry etching using a resist as a mask. As a result, as shown in FIG. 5L, a third layer (sealing layer) 60 sealing at least the through hole 52a of the second layer 52 is formed on the second layer 52.

Figure 5M:
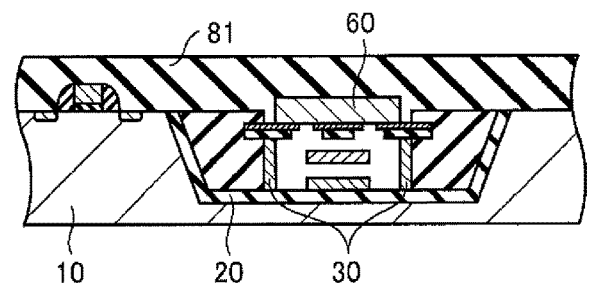
Figure 5N:
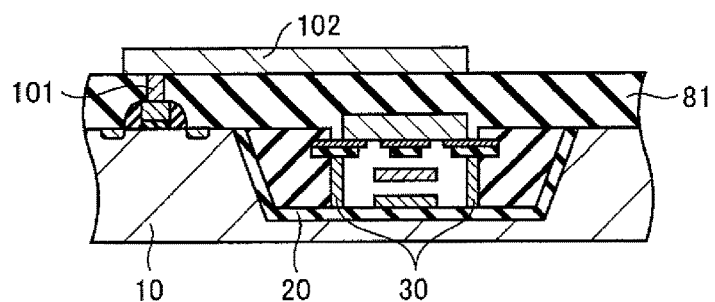

Next, as shown in FIG. 5M, on the substrate 10 having the sealing layer 60 and the like formed thereon, an interlayer insulation film 81 made of silicon dioxide ($SiO_2$), BPSG or the like is formed and planarized. Also, as shown in FIG. 5N, an opening is formed in the interlayer insulation film 81 by dry etching using a resist as a mask, and a contact plug 101 that is made of tungsten (W) or the like and is electrically connected to the circuit element is fitted into the opening. Furthermore, an interconnect 102 that is made of aluminum (Al) or the like and is electrically connected to the contact plug 101 is formed on the interlayer insulation film 81.

Figure 5O:
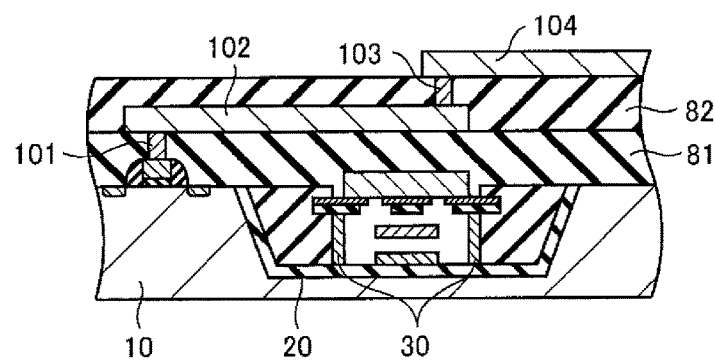

Next, as shown in FIG. 5O, on the substrate 10 having the interconnect 102 and the like formed thereon, an interlayer insulation film 82 made of silicon dioxide ($SiO_2$), BPSG or the like is formed and planarized. Also, an opening is formed in the interlayer insulation film 82 by dry etching using a resist as a mask, and a contact plug 103 that is made of tungsten (W) or the like and is electrically connected to the interconnect 102 is fitted into the opening. Furthermore, an interconnect 104 that is made of aluminum (Al) or the like and is electrically connected to the contact plug 103 is formed on the interlayer insulation film 82.

According to the present embodiment, the cover portion 50 covering the hollow in which the functional element is disposed is configured to have a two-layer structure including at least the first layer 51 and the second layer 52, and after the micro through hole 52a has been formed in the second layer 52, the through hole 51a having a diameter larger than the through hole 52a is formed in the first layer 51, and the thickness of the sealing layer 60 is thereby reduced. It is therefore possible to miniaturize the electronic apparatus while maintaining the strength of the cover portion 50.

Oscillator

Next, an oscillator that uses the electronic apparatus according to an embodiment of the invention will be described.

Figure 6:
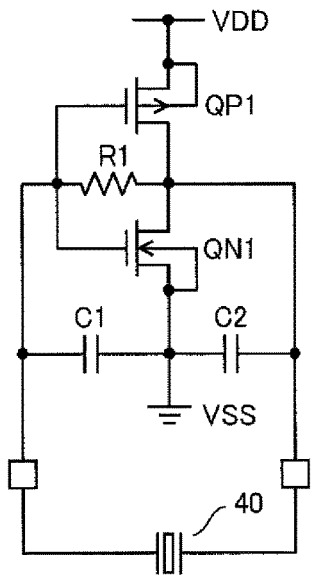
FIG. 6 is a circuit diagram showing a configuration example of an oscillator according to an embodiment of the invention.

FIG. 6 is a circuit diagram showing a configuration example of an oscillator according to an embodiment of the invention. As shown in FIG. 6, an oscillator 110 according to an embodiment of the invention includes, in addition to the resonator 40 as a functional element formed in the electronic apparatus according to an embodiment of the invention, a P channel MOS transistor QP1, an N channel MOS transistor QN1, a feedback resistor R1, and capacitors C1 and C2. The transistors QN1 and QP1, the feedback resistor R1 or the capacitors C1 and C2 may be provided in the electronic apparatus according to an embodiment of the invention, or may be provided outside the electronic apparatus.

The source of the transistor QP1 receives a supply of high-potential side power supply potential VDD, the source of the transistor QN1 receives a supply of low-potential side power supply potential VSS, and the transistors QP1 and QN1 thereby constitute an inverter. The gates of the transistors QP1 and QN1 correspond to an input terminal of the inverter, and the drains of the transistors QP1 and QN1 correspond to an output terminal of the inverter.

The capacitor C1 is connected between the input terminal of the inverter and an interconnect of power supply potential VSS, and the capacitor C2 is connected between the output terminal of the inverter and an interconnect of power supply potential VSS. The resonator 40 and the feedback resistor R1 are connected in parallel between the input terminal and the output terminal of the inverter.

The inverter performs an inverting amplifier operation, and a signal output from the output terminal is fed back to the input terminal via the resonator 40 and the feedback resistor R1. At this time, the resonator 40 is vibrated by an alternating voltage applied by the inverter. The vibration is excited significantly at a specific resonant frequency, and the resonator 40 performs operation as a negative resistor. As a result, the oscillator 110 oscillates at an oscillation frequency determined primarily by the resonant frequency of the resonator 40.

According to the present embodiment, it is possible to provide a miniaturized oscillator by using the electronic apparatus that has been miniaturized while maintaining the strength of the cover portion that covers the hollow in which the functional element is disposed. In particular, by providing the transistors, the resistor and the like constituting the oscillator in the electronic apparatus, the oscillator can be further miniaturized and can be caused to perform a stable oscillation operation.

Electronic Appliance

Next, an electronic appliance that uses the electronic apparatus according to an embodiment of the invention will be described.

Figure 7:
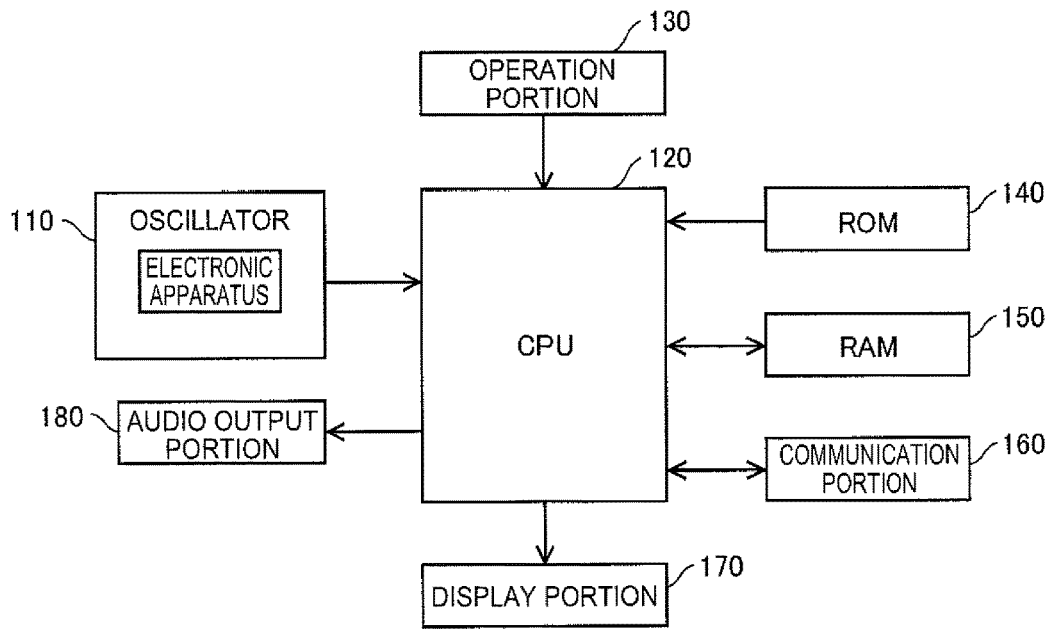
FIG. 7 is a block diagram showing a first configuration example of an electronic appliance according to an embodiment of the invention.

FIG. 7 is a block diagram showing a first configuration example of an electronic appliance according to an embodiment of the invention. As shown in FIG. 7, the electronic appliance includes an oscillator 110 that uses the electronic apparatus according to an embodiment of the invention, and may further include a CPU120, an operation portion 130, a ROM (read-only memory) 140, a RAM (random access memory) 150, a communication portion 160, a display portion 170 and an audio output portion 180. The constituent elements shown in FIG. 7 may be partially omitted or changed. Alternatively, an additional constituent element may be added to the constituent elements shown in FIG. 7.

The oscillator 110 includes an electronic apparatus in which a resonator is formed as a functional element, and generates a clock signal by oscillating at an oscillation frequency determined primarily by the resonant frequency of the resonator. The clock signal generated by the oscillator 110 is supplied to the constituent elements of the electronic appliance via the CPU120 and the like.

The CPU120 performs operation in synchronization with the clock signal supplied from the oscillator 110, and performs various types of signal processing and control processing in accordance with a program stored in the ROM 140 or the like. For example, the CPU120 performs various types of data processing according to an operation signal supplied from the operation portion 130, and controls the communication portion 160 to perform data communication with an external apparatus. Alternatively, the CPU120 generates an image signal for displaying various types of images on the display portion 170, and generates an audio signal for causing the audio output portion 180 to output various types of sounds.

The operation portion 130 is an input apparatus including, for example, an operation key, a button switch and the like, and outputs an operation signal corresponding to an operation input by a user to the CPU120. The ROM 140 stores therein a program, data and the like for the CPU120 to perform various types of computation processing and control processing. The RAM 150 is used as a work area for the CPU120, and temporarily stores therein a program and data read from the ROM 140, data input through the operation portion 130, results of computation executed by the CPU120 in accordance with a program, or the like.

The communication portion 160 is composed of, for example, an analog circuit or a digital circuit, and performs data communication between the CPU120 and an external apparatus. The display portion 170 includes, for example, an LCD (liquid crystal display apparatus) or the like, and displays various types of information based on a display signal supplied from the CPU120. The audio output portion 180 includes, for example, a speaker or the like, and outputs a sound based on an audio signal supplied from the CPU120.

Examples of the above-described electronic appliance include a mobile terminal such as a mobile phone, a smart card, an electronic calculator, an electronic dictionary, an electronic gaming device, a digital still camera, a digital movie, a television set, a video phone, a surveillance TV monitor, a head-mounted display, a personal computer, a printer, a network device, a car navigation apparatus, a measurement device, a medical device (for example, an electronic clinical thermometer, a blood pressure meter, a blood glucose meter, an electrocardiographic measurement apparatus, an ultrasound diagnostic apparatus and an electronic endoscope), and the like.

Figure 8:
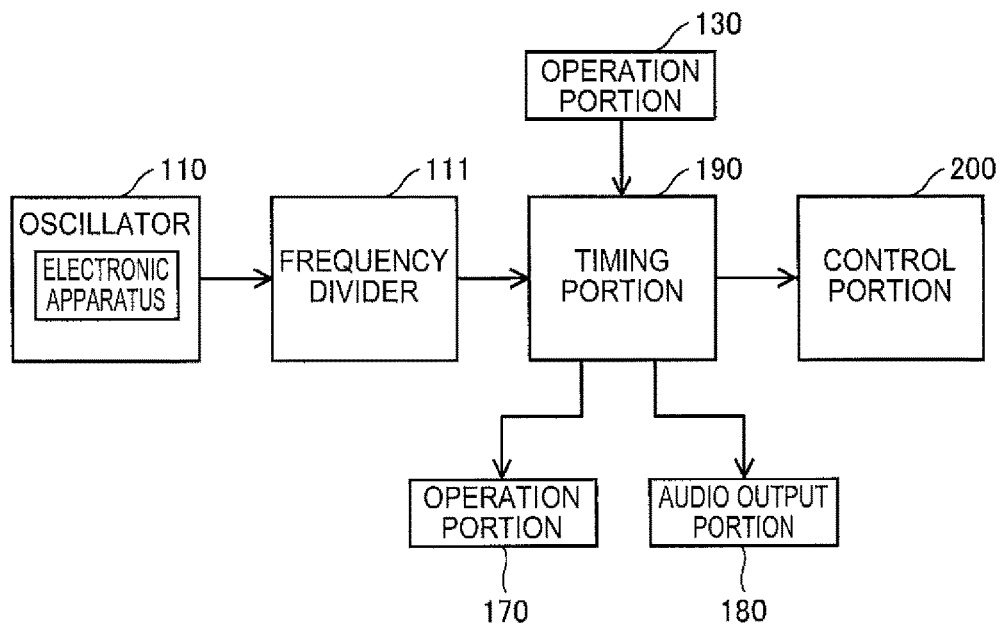
FIG. 8 is a block diagram showing a second configuration example of an electronic appliance according to an embodiment of the invention.

FIG. 8 is a block diagram showing a second configuration example of an electronic appliance according to an embodiment of the invention. In this example, a description of a clock and a timer will be given. A clock according to an embodiment of the invention includes an oscillator 110 that uses the electronic apparatus according to an embodiment of the invention, a frequency divider 111, an operation portion 130, a display portion 170, an audio output portion 180, and a timing portion 190. A timer according to an embodiment of the invention includes a control portion 200 instead of the audio output portion 180.

The frequency divider 111 is composed of, for example, a plurality of flip-flop circuits or the like, and divides a clock signal supplied from the oscillator 110 so as to generate a frequency-divided clock signal for timing. The timing portion 190 is composed of, for example, a counter or the like, and performs a timing operation based on the frequency-divided clock signal supplied from the frequency divider 111 so as to generate display signals indicating the current time and an alarm time, as well as an alarm signal for generating an alarm.

The operation portion 130 is used to set the current time and an alarm time in the timing portion 190. The display portion 170 displays the current time or an alarm time according to a display signal supplied from the timing portion 190. The audio output portion 180 generates an alarm sound according to an alarm signal supplied from the timing portion 190.

In the case of the timer, a timer function is provided instead of the alarm function. To be specific, the timing portion 190 generates a timer signal indicating that the current time has matched the set time. The control portion 200 turns on or off a device connected to the timer according to the timer signal supplied from the timing portion 190.

According to the present embodiment, it is possible to provide an electronic appliance in which the oscillator that generates a clock signal is miniaturized by using the electronic apparatus that has been miniaturized while maintaining the strength of the cover portion that covers the hollow in which the functional element is disposed.

Mobile Unit

Next, a mobile unit that uses the electronic apparatus according to an embodiment of the invention will be described. Examples of the mobile unit include an automobile, a self-propelled robot, a self-propelled transporting device, a railway train, a vessel, an airplane, and an artificial satellite.

Figure 9:
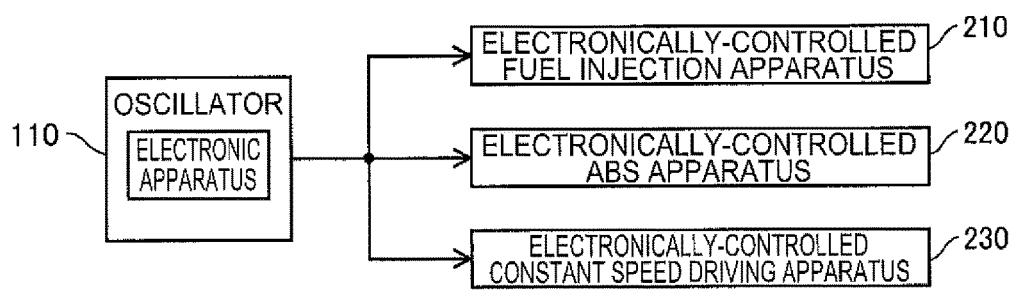
FIG. 9 is a block diagram showing a configuration example of a mobile unit according to an embodiment of the invention.

FIG. 9 is a block diagram showing a configuration example of a mobile unit according to an embodiment of the invention. As shown in FIG. 9, the mobile unit includes an oscillator 110 that uses the electronic apparatus according to an embodiment of the invention, and may further include various types of electronically-controlled apparatuses such as an electronically-controlled fuel injection apparatus 210, an electronically-controlled ABS apparatus 220 and an electronically-controlled constant speed driving apparatus 230. The constituent elements shown in FIG. 9 may be partially omitted or changed. Alternatively, an additional constituent element may be added to the constituent elements shown in FIG. 9.

The oscillator 110 includes an electronic apparatus in which a resonator is formed as a functional element, and generates a clock signal by oscillating at an oscillation frequency determined primarily by the resonant frequency of the resonator. The clock signal generated by the oscillator 110 is supplied to the electronically-controlled fuel injection apparatus 210, the electronically-controlled ABS apparatus 220, the electronically-controlled constant speed driving apparatus 230 and the like.

The electronically-controlled fuel injection apparatus 210 performs operation in synchronization with the clock signal supplied from the oscillator 110, and injects a liquid fuel in the form of a mist into intake air at a predetermined timing in a premix combustion engine such as a gasoline engine. The electronically-controlled ABS (antilock braking system) apparatus 220 performs operation in synchronization with the clock signal supplied from the oscillator 110, and repeats the following operations: in response to an operation to put on a brake, actuating the brake so as to be gradually strong; and in response to the mobile unit starting to slip, temporarily releasing the brake and again actuating the brake. The electronically-controlled constant speed driving apparatus 230 performs operation in synchronization with the clock signal supplied from the oscillator 110, and controls the accelerator, the brake or the like so as to maintain the speed of the mobile unit at a constant level while monitoring the speed of the mobile unit.

According to the present embodiment, it is possible to provide a mobile unit in which the oscillator that generates a clock signal is miniaturized by using the electronic apparatus that has been miniaturized while maintaining the strength of the cover portion that covers the hollow in which the functional element is disposed.

The embodiment given above has been described using an electronic apparatus in which a cavity is formed within a trench of a semiconductor substrate, but the invention is not limited to the embodiment described above. The invention is also applicable to, for example, an electronic apparatus in which a cavity is formed on a substrate, and various modifications can be made by a person having ordinary skill in the art within the technical scope of the invention.

It is to be understood that, in the present application, the expression "a specific element B (hereinafter referred to as the element B) is formed on (or under) a specific element A (hereinafter referred to as the element A)" is not limited to a case where the element B is formed directly on (or under) the element A, and it also encompasses a case where the element B is formed on (under) the element A with another element interposed therebetween as long as the advantageous effects of the invention are not impaired.

It is also to be understood that a configuration expressed by "on" (or "under") is not necessarily limited to one direction. For example, the expression "the element B is formed on (or under) the element A" encompasses, if the semiconductor apparatus is used upside down, a case where the element B is formed under (or on) the element A.

The entire disclosure of Japanese Patent Application No. 2015-149342, filed Jul. 29, 2015 is expressly incorporated by reference herein.

What is claimed is:

1. An electronic apparatus comprising:
    a substrate;
    a trench formed in the substrate;
    a first insulation film disposed on the bottom and sides of the trench and directly on the substrate;
    a side wall that is spaced from the portion of the first insulation film on the sides of the trench to form a space between an exterior surface of the side wall and the portion of the first insulation film on the sides of the trench, the side wall being disposed directly on the portion of the first insulation film on the bottom of the trench and also forming a hollow separated from the space by the side wall and bounded by interior surfaces of the side wall;
    a second insulation film within the trench and filling the space between the exterior of the side walls and the portion of the first insulation film on the sides of the trench;
    a functional element that is disposed within the hollow;
    a first layer that is disposed on the side wall so as to cover the hollow and has a first through hole that communicates with the hollow;
    a second layer that is disposed on the first layer so as to cover the hollow and has a second through hole that has a diameter smaller than a diameter of the first through hole and at least partially overlaps the first through hole as viewed in plan view; and
    a third layer that is disposed on the second layer so as to seal at least the second through hole.

2. The electronic apparatus according to claim 1, wherein the first layer has a rigidity higher than the second layer.

3. The electronic apparatus according to claim 1, wherein the first layer is thicker than the second layer.

4. The electronic apparatus according to claim 1, wherein the second through hole has a diameter of 0.3 μm or less.

5. The electronic apparatus according to claim 1, wherein the side wall and the functional element are disposed within a surface recess of the substrate.

6. The electronic apparatus according to claim 5, wherein the surface recess is disposed in a first region of the substrate, and a MOS transistor is disposed in a second region of the substrate.

7. An oscillator comprising the electronic apparatus according to claim 1.

8. An electronic appliance comprising the electronic apparatus according to claim 1.

9. A mobile unit comprising the electronic apparatus according to claim 1.

10. An oscillator comprising the electronic apparatus according to claim 2.

11. An oscillator comprising the electronic apparatus according to claim 3.

12. An oscillator comprising the electronic apparatus according to claim 4.

13. An oscillator comprising the electronic apparatus according to claim 5.

14. An oscillator comprising the electronic apparatus according to claim 6.

15. An electronic appliance comprising the electronic apparatus according to claim 2.

16. An electronic appliance comprising the electronic apparatus according to claim 3.

17. An electronic appliance comprising the electronic apparatus according to claim 4.

18. An electronic appliance comprising the electronic apparatus according to claim 5.

* * * * *